United States Patent
Marr

(10) Patent No.: US 6,285,062 B1
(45) Date of Patent: *Sep. 4, 2001

(54) ADJUSTABLE HIGH-TRIGGER-VOLTAGE ELECTROSTATIC DISCHARGE PROTECTION DEVICE

(75) Inventor: Ken W. Marr, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/310,288

(22) Filed: May 12, 1999

(51) Int. Cl.[7] .................................................. H01L 23/62
(52) U.S. Cl. ........................................... 257/361; 257/362
(58) Field of Search .................................... 257/173, 174, 257/356, 357, 358, 359, 360, 361, 362, 363

(56) References Cited

U.S. PATENT DOCUMENTS

| Re. 36,024 | * | 1/1999 | Ho et al. .............................. 257/356 |
| 5,017,985 | * | 5/1991 | Lin . |
| 5,027,252 | * | 6/1991 | Yamamura ............................... 361/88 |
| 5,493,142 | | 2/1996 | Randazzo et al. .................... 257/328 |
| 5,604,369 | * | 2/1997 | Duvvury et al. ...................... 257/360 |
| 5,701,024 | | 12/1997 | Watt ........................................ 257/360 |
| 5,880,501 | * | 3/1999 | Nagai ...................................... 257/355 |
| 5,895,958 | * | 4/1999 | Miki ....................................... 257/355 |

* cited by examiner

*Primary Examiner*—Ngân V. Ngô
(74) *Attorney, Agent, or Firm*—Williams, Morgan & Amerson, P.C.

(57) ABSTRACT

An apparatus includes a first doped region, a first doped well, a first doped plug, a second doped plug, and an isolation structure. The first doped well is disposed within the first doped region. The first doped plug is disposed within the first doped well. The second doped plug is disposed within the first doped region. The isolation structure is disposed between the first and second doped plugs. A method includes providing a first doped region. A first doped well is formed within the first doped region, and a first doped plug is formed within the first doped well. A second doped plug is formed within the first doped region, and an isolation structure is formed between the first and second doped plugs.

31 Claims, 7 Drawing Sheets

ADJUSTABLE HIGH-TRIGGER-VOLTAGE ELECTROSTATIC DISCHARGE PROTECTION DEVICE

BACKGROUND OF THE INVENTION

1. Field of the Invention

This invention relates generally to integrated circuits, and, more particularly, to an adjustable high-trigger-voltage ESD protection device.

2. Description of the Related Art

Electrostatic discharge (ESD) is a known phenomenon capable of destroying integrated circuits. In ESD, a relatively large pulse of current, originating from an outside source, is delivered unintendedly to elements of an integrated circuit (IC). One outside source of ESD is the human body. The human body is capable of storing and then discharging energy. The human body may on certain occasions charge to 20 kV simply through ordinary movement such as walking over a carpet. Other objects such as solder irons and printed circuit boards are also capable of storing and then discharging energy. Electrostatic discharge may destroy an IC when a relatively large amount of stored energy discharges in a relatively short amount of time into the IC through a conductive path established when the IC comes into contact with a charged person or object.

Although a variety of integrated devices may be susceptible to damage from an ESD vent, metal oxide semiconductors (MOS) are particularly susceptible due to the low voltages required to cause damage to the gate oxide. An ESD pulse supplied to a MOS transistor through the gate may break down the dielectric gate oxide barrier between the gate and the channel, which may lead to permanent damage by leaving a conductive path of ionized dielectric or trapped electrons, or by burning a hole in the gate oxide. The possible results of an ESD event include crippling the device functionality, decreasing the device life cycle, or destroying the device.

FIG. 1A illustrates a block diagram of a conventional integrated circuit device 20. The integrated circuit device 20 includes internal circuit components 22 and an external bond pad 24. The external bond pad 24 facilitates interfacing the integrated circuit device 20 with other electrical components (not shown). In the integrated circuit device 20 shown in FIG. 1A, the external bond pad 24 functions as an input pad. An input buffer 25 is coupled between the external bond pad 24 and the internal circuit components 22. The integrated circuit device 20 also includes an ESD protection device 26 coupled to the external bond pad 24, which protects the internal circuit components 22, the external bond pad 24, and input buffer 25 by reducing or eliminating the effects of an ESD event.

It is well known in the industry that the ESD protection device 26 may have many different embodiments. FIG. 1B illustrates a cross-sectional view of a field device 30 used as the ESD protection device 26 in FIG. 1A. The field device 30 includes drain, source, and gate terminals 32, 34, 36. In addition, the field device 30 includes a substrate 37. Typically, the external bond pad 24 is coupled to the drain terminal 32 of the field device 30, and the source and gate terminals 34, 36 are coupled to a ground node 38 or to a power supply node (not shown). The field device 30 remains "off" (i.e., does not conduct current) until a sufficiently large pulse of current (e.g., an ESD event) is applied to the terminal of the external bond pad 24. The field device 30 switches "on" (i.e., begins to conduct current) once the voltage of the external bond pad 24 increases, from an external event, beyond the reverse-bias breakdown voltage of the field device 30. The reverse-bias breakdown voltage, also known as the trigger voltage or breakover voltage, is the voltage necessary to establish a conductive path between the source and drain terminals 34, 32 through the substrate 37 of the field device 30.

FIGS. 2 and 3 are illustrative embodiments of a pn junction, which are representative of the pn junction between the drain terminal 32 and the substrate 37 of the field device 30 shown in FIG. 1B. Those of ordinary skill in the art will appreciate that FIGS. 2 and 3 are models of a semiconductor device useful as an aid in the understanding of the breakover voltage of the field device 30 shown in FIG. 1B.

Those of ordinary skill in the art will appreciate that semiconductor material may be made either N-type or P-type by doping the semiconductor material with the appropriate dopant material (e.g, boron, phosphorous, etc.) Furthermore, in order to aid in the illustrations, the semiconductor material may be labeled with a p (P-type doping) or with an n (N-type doping.) In addition, the semiconductor material may be heavily doped, denoted with a "+", or lightly doped, denoted with a "−".

FIG. 2 shows a generalized pn junction 40 with a reverse-bias voltage applied to the terminals 41, 42 of the pn junction 40. The pn junction 40 includes a lightly doped n-type material 43 (denoted with an n−) and a lightly doped p-type material 44 (denoted with a p−). The center of the pn junction is marked by a centerline 46.

Because of the charges associated with the n-type and p-type material 43, 44, a space charge region 48 exists in the center of the pn junction 40. The space charge region 48 includes a first boundary 50 that extends partially into the n-type material 43 and a second boundary 52 that extends partially into the p-type material 44. The first boundary 50 of the space charge region 48 is positively charged, and the second boundary 52 is negatively charged. The charge of the first and second boundaries 50, 52 results in a potential difference across the space charge region 48, hence, an electric field is produced across the space charge region 48.

Initially, the width of the space charge region 48 is a function of the doping concentrations of the n-type and p-type materials 43, 44 of the pn junction 40 (i.e., the width of the space charge region 48 depends on the charge concentration of the n-type and p-type materials 43, 44). As the reverse-bias voltage applied to the terminals 41, 42 of the pn junction 40 increases, the first and second boundaries 50, 52 of the space charge region 48 extend further into the n-type and p-type materials 43, 44 away from the divider 46, which is illustrated by positions 54 and 56 in FIG. 2. Because the doping concentrations of the n-type and p-type material 43, 44 are approximately equal, the space charge region 48 widens in a substantially symmetric manner, as shown in FIG. 2.

The width of the space charge region 48 continues to expand as the reverse-bias voltage applied to the terminals 41, 42 of the pn junction 40 increases. In addition, the electric field continues across the extended space charge region 48, and the electric field intensifies as the reverse-bias voltage increases. Eventually, the reverse-bias voltage reaches the breakdown voltage (e.g., 30–50V) of the lightly doped pn junction 40. At the breakdown voltage, the intensity of the electric field reaches a critical value and current begins to flow between the terminals 41, 42 across the pn junction 40.

FIG. 3 is an illustrative embodiment of the pn junction formed between the substrate 37 and the drain 32 of the field device 30. A reverse-bias voltage is applied to the external bond pad 24. The center of the pn junction 60 is marked by a centerline 62.

Because of the more heavily doped drain 32, a space charge region 64 is not symmetrically disposed about the centerline 62, but extends predominately into the lightly doped substrate 37, as shown in FIG. 3. A first boundary 66 of the space charge region 64 is essentially pinned by the heavily doped drain 32 and resides relatively close to the centerline 62 of the pn junction. A second boundary 68 is located in the lightly doped substrate 37. Because the first boundary 66 of the space charge region 64 is essentially pinned by the heavily doped drain 32, increasing the reverse-bias voltage results in the space charge region 64 expanding predominately into the substrate 37, which is illustrated by positions 70 and 72 in FIG. 3 (i.e., any increase in reverse-bias voltage will result in a substantially asymmetric widening of the space charge region 64).

The width of the space charge region 64 will continue to expand as the reverse-bias voltage applied to the external bond pad 24 increases. In addition, the electric field continues across the extended space charge region 64, and the electric field intensifies as the reverse-bias voltage increases. Because the heavily doped drain 32 essentially pins the first boundary 66, the space charge region 64 widens at a reduced rate, thus, the electric field reaches a critical value at a lower reverse-bias voltage, consequently, resulting in a lower breakdown voltage (e.g., 10–12V).

Typically, the ESD protection device 26 (shown in FIG. 1A) dissipates an ESD pulse through snapback, a phenomenon well known to those skilled in the art. FIG. 4 illustrates the current (I) versus voltage (V) characteristics of a typical ESD protection device operating in a snapback mode. The breakover voltage (Vbv), also known as the trigger voltage or reverse-bias breakdown voltage, is the voltage at which the ESD protection device switches "on" (i.e., begins to conduct current). Once the voltage applied to the external bond pad 24 reaches the breakover voltage (Vbv) conduction begins, and the voltage of the external bond pad 24 decreases to a value known as the snapback voltage (Vsb). Increases in the voltage of the external bond pad 24 above the snapback voltage (Vsb) after snapback has occurred results in relatively large increases in current, as shown in FIG. 4 by the steep upward slope of the graph above a inflection point 74 at Vsb.

By operating in a snapback mode, the ESD protection device 26 (shown in FIG. 1A) decreases the voltage of the input buffer 25 to Vsb, consequently, protecting the external bond bad 24 from excessive voltages. In addition, because snapback reduces the voltage of the external bond pad 24 to Vsb, the power dissipated through the ESD protection device decreases during an ESD event, and the ESD pulse may be safely dissipated without destroying the ESD protection device 26.

The prior art method, however, suffers from at least one shortcoming in that the ESD protection device 26 of FIGS. 1A and 1B shunts any signal with a voltage greater in magnitude than the reverse-bias breakdown voltage. Certain integrated circuit devices include programming pins that require a high voltage (e.g., 20V) to program devices, such as anti-fuses, within the device. The programming voltage is typically greater than the reverse-bias breakdown voltage of standard ESD protection devices, making them unusable. The ESD protection circuit 20 of FIG. 1A may switch "on" prematurely when used in conjunction with the high voltage programming pins, and prevent the programming from being accomplished. Thus, the circuit of FIG. 1A is unsuitable for protecting high voltage programming pins.

The breakover voltage for the field device 30 of FIG. 1B is slightly tunable by varying process parameters, such as doping levels. However, because programming voltages for devices may vary, it would be desirable to have an ESD protection device that has a highly adjustable breakover voltage.

The present invention is directed to overcoming, or at least reducing the effects of, one or more of the problems set forth above.

SUMMARY OF THE INVENTION

In one aspect of the present invention, an apparatus is provided. The apparatus includes a first doped region, a first doped well, a first doped plug, a second doped plug,, and an isolation structure. The first doped well is disposed within the first doped region. The first doped plug is disposed within the first doped well. The second doped plug is disposed within the first doped region. The isolation structure is disposed between the first and second doped plugs.

In another aspect of the present invention, a method is provided. The method includes providing a first doped region. A first doped well is formed within the first doped region, and a first doped plug is formed within the first doped well. A second doped plug is formed within the first doped region, and an isolation structure is formed between the first and second doped plugs.

BRIEF DESCRIPTION OF THE DRAWINGS

The invention may be best understood by reference to the following description taken in conjunction with the accompanying drawings, in which like reference numerals identify like elements, and in which.

Figure 1A:
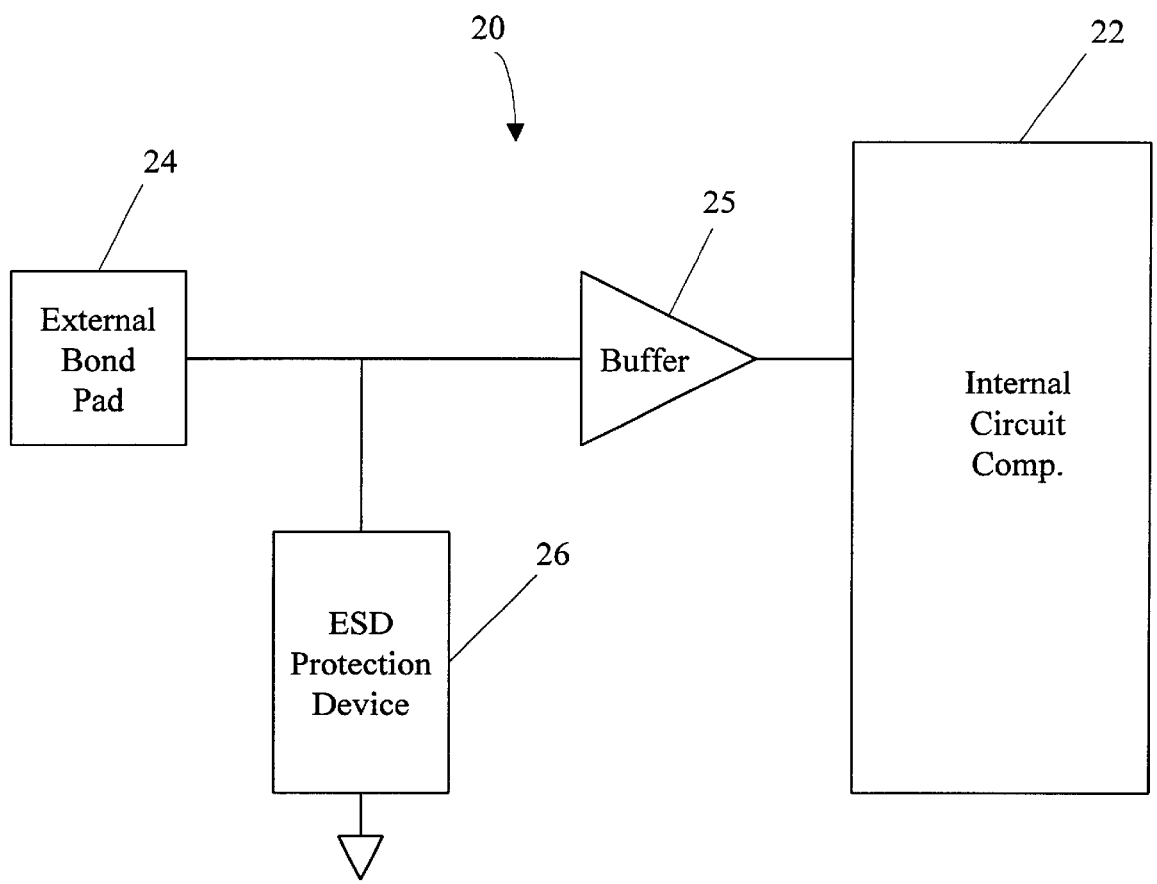
FIG. 1A is a block diagram of an integrated circuit device including a prior art ESD protection device.
Figure 1B:
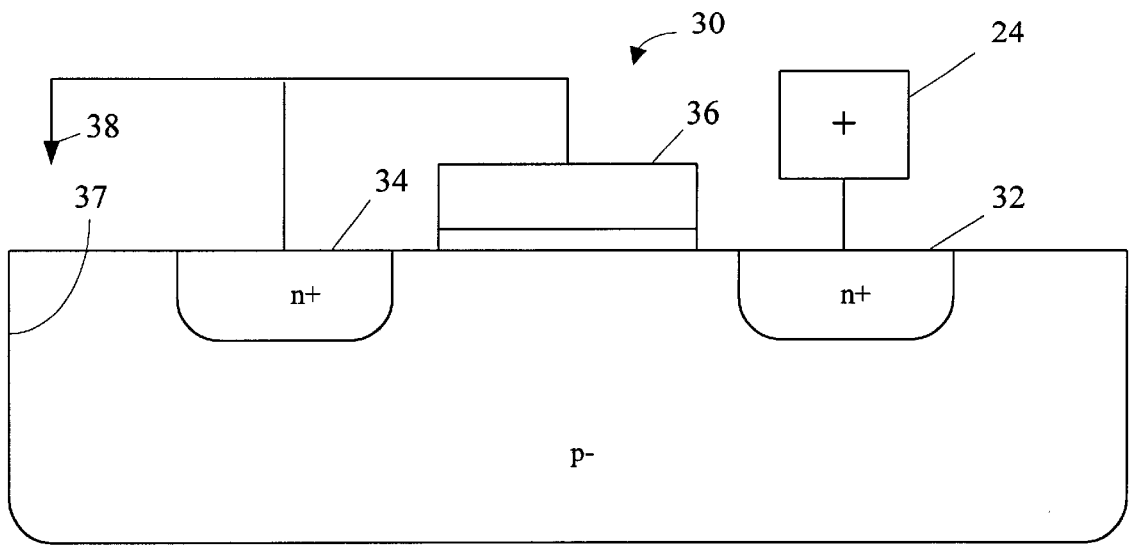
FIG. 1B is a cross-sectional view of the prior art ESD protection device of FIG. 1A.
Figure 2:
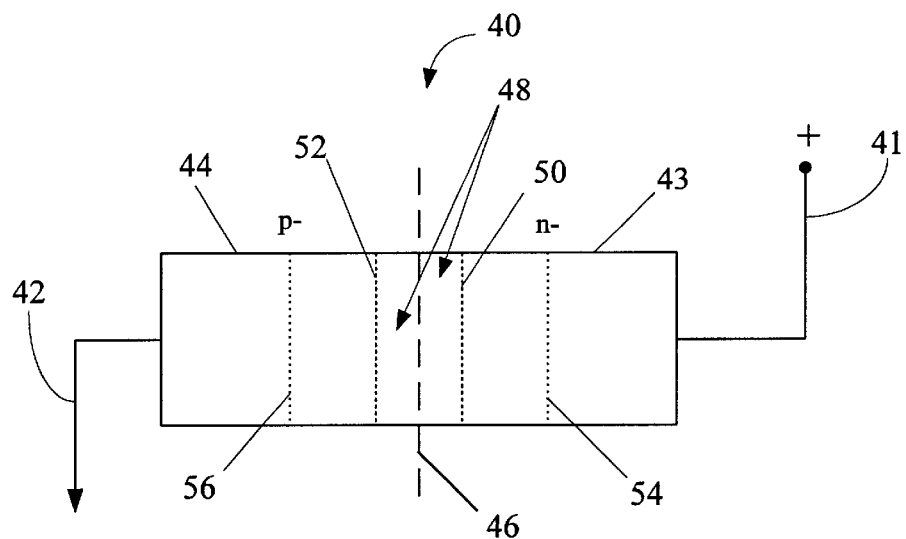
FIG. 2 is a generalized representation of a prior art pn junction.
Figure 3:
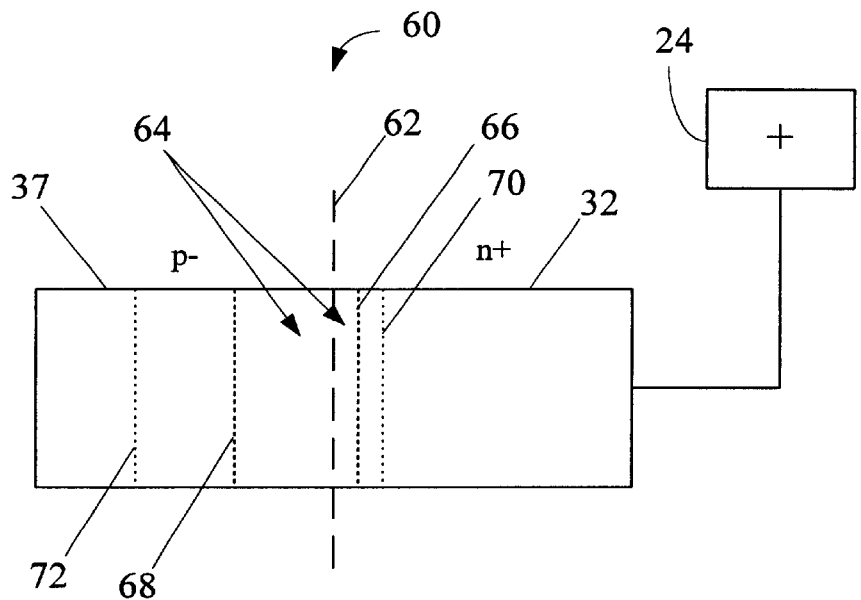
FIG. 3 is a representation of a pn junction of the prior art ESD protection device of FIG. 1A.
Figure 4:
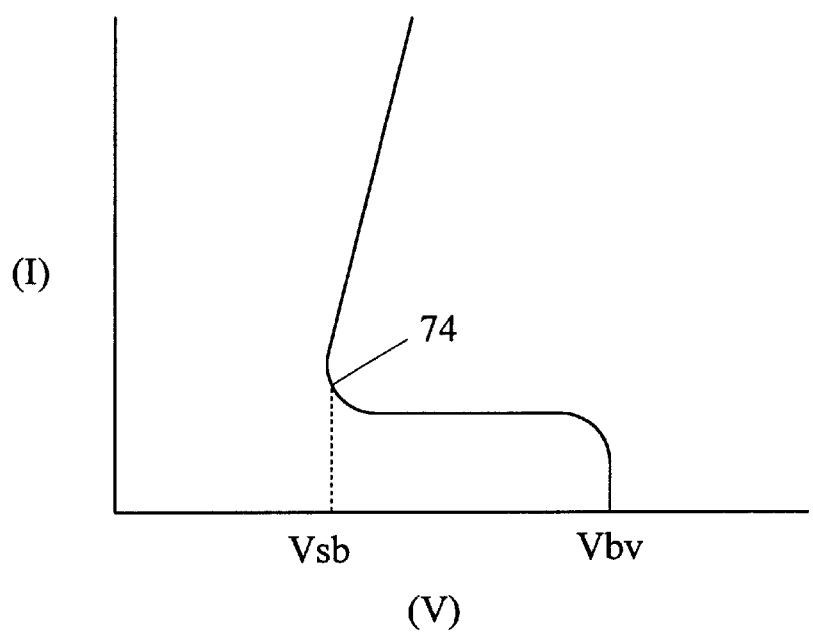
FIG. 4 is a current vs. voltage curve illustrating the operation of the prior art ESD protection device in a snapback mode.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 5–10. Although the various regions and structures of a semiconductor device are depicted in the drawings as having very precise, sharp configurations and profiles, those skilled in the art recognize that, in reality, these regions and structures are not as precise as indicated in the drawings, (e.g., the regions may have rounded edges). Additionally, the relative size of the features shown in the drawings may be exaggerated or reduced. Nevertheless, the attached drawings are included to provide an illustrative example of the present invention.

Figure 5:
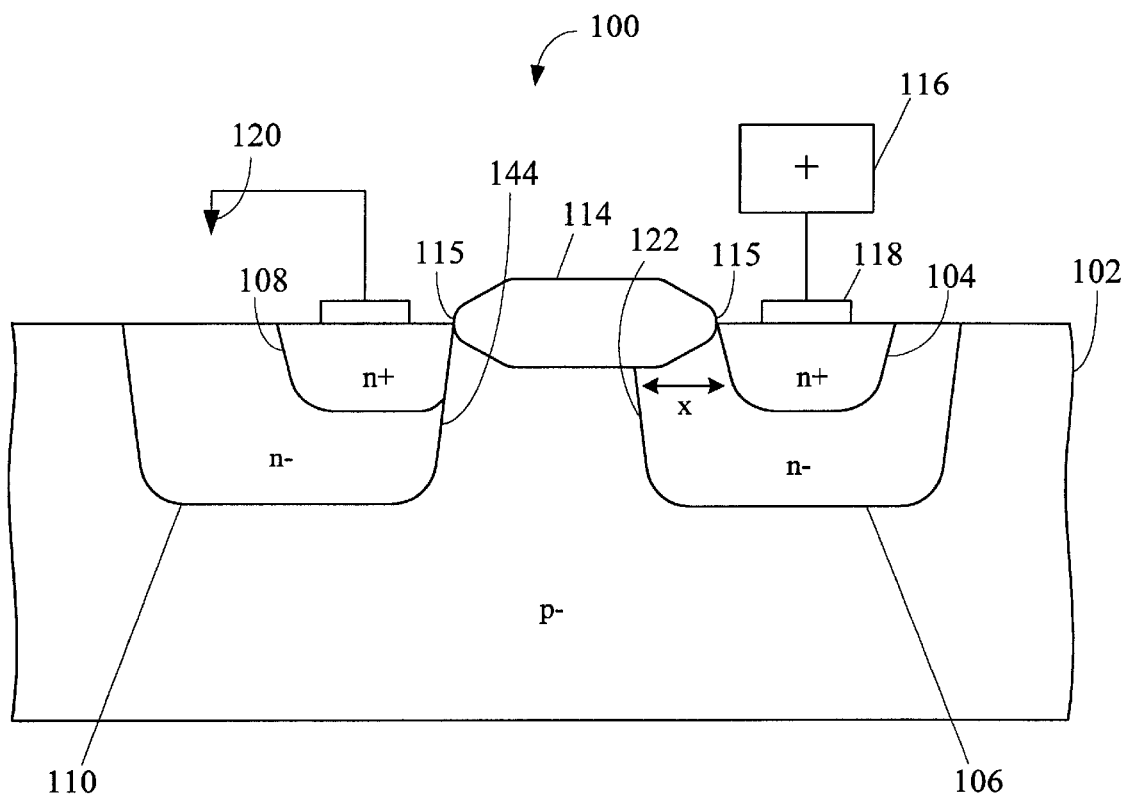
FIG. 5 is a cross-sectional view of an ESD protection device in accordance with the present invention.

FIG. 5 illustrates one embodiment of an ESD protection device 100 in accordance with the present invention. The ESD protection device 100 is fabricated on a semiconductor substrate 102 (e.g., silicon) using standard transistor fabrication techniques and includes a first n-plug 104 positioned within a first n-well 106 and a second n-plug 108 positioned within a second n-well 110. The first and second n-wells 106, 110 are disposed within the substrate 102 and are separated by an isolation structure 114. It is contemplated that the first and second n-wells 106, 110 may also be disposed in a p-well (i.e., a P-type doped region, not shown) that has been formed in a N-type doped substrate (not shown).

The isolation structure 114 functions to electrically isolate the first and second n-wells 106, 110 and to electrically isolate the first and second n-plugs 104, 108. Those of ordinary skill in the art will appreciate that the isolation structure 114 may be formed in a variety of ways (e.g., grown, deposited, etc.) and from a variety of materials (e.g., silicon dioxide, silicon nitride, etc.). For example, the isolation structure may be surface trench isolation (STI) or any other structure adapted to electrically isolate adjacent components. In one embodiment, the isolation structure 114 is a LOCOS oxide.

In one embodiment, it is contemplated that the ESD protection device 100 may be formed without placing the isolation structure 114 between the first and second n-wells 106, 110. For example, the first and second n-wells 106, 110 may be formed in the semiconductor substrate 102 using a variety of known masking techniques, and the first and second n-wells 106, 110 may be separated by a distance that may be varied as a matter of design choice.

Those of ordinary skill in the art will appreciate that a variety of methods may be used to introduce impurity atoms (dopants) into the semiconductor substrate 102 to form the negatively charged first and second n-wells 106, 110 shown in FIG. 5. For example, ion implantation and diffusion may be used along with a photolithography process to selectively introduce impurity atoms to the semiconductor substrate 102, thus, forming the first and second n-wells 106, 110. In addition, a variety of dopant materials (e.g., phosphorous, etc.) may be used to form the first and second n-wells 106, 110 shown in FIG. 5.

Although the first and second n-wells 106, 110 appear to be spaced apart an equal distance from the isolation structure 114 and also appear to be symmetrical, it is contemplated that the first and second n-wells 106, 110 may be variously positioned, of any shape, and may be asymmetric. For example, the first n-well 106 may be spaced a distance away from the isolation structure 114, or the second n-well 110 may be formed having a greater depth into the semiconductor substrate 102. Those of ordinary skill in the art will appreciate that the application and the available technology will determine the doping concentration, location, and dimensions of the first and second n-wells 106, 110.

A variety of techniques may be used to form the first and second n-plugs 104, 108 shown in FIG. 5. The first and second n-plugs 104, 108 may be formed in a similar manner to forming the first and second n-wells 106, 110. The first and second n-plugs 104, 108 are doped with a relatively heavy concentration of impurity atoms (e.g., phosphorous, etc.), as denoted by the "n+" in FIG. 5.

Although the first and second n-plugs 104, 108 appear to be similar, it is contemplated that the first and second n-plugs 104, 108 need not have equal dimensions or doping concentrations. For example, the second n-plug 108 may be formed with a greater depth, and thus, extend further into the second n-well 110. Again, the application and the available technology will determine the doping concentration, location, and dimensions of the first and second n-plugs 104, 108.

The first n-plug 104 is coupled to the terminal of an external bond pad 116. The terminal of the external bond pad 116 may be coupled to the first n-plug 104 in a variety of ways. For example, in one embodiment, a polysilicon layer 118 may facilitate the electrical connection between the terminal of the external bond pad 116 and the first n-plug 104. Alternatively, a metal layer (e.g., aluminum, not shown) may also provide the necessary medium to couple the first n-plug 104 to the terminal of the external bond pad 116. In a similar manner, the second n-plug 108 is coupled to a ground node 120 or to a power supply node (not shown).

The first n-plug 104 is positioned a distance "x" from a first edge 122 of the first n-well 106, as shown in FIG. 5. The breakover voltage of the ESD protection device 100 is tunable by adjusting the distance "x" (i.e., the breakover voltage of the ESD protection device 100 may be increased and decreased by increasing and decreasing the distance "x," respectively). For example, if the distance "x" is increased, the breakover voltage increases. If the distance "x" is decreased, the breakover voltage decreases. The adjustable breakover voltage of the ESD protection device 100 may best be explained with reference to FIG. 6.

Figure 6:
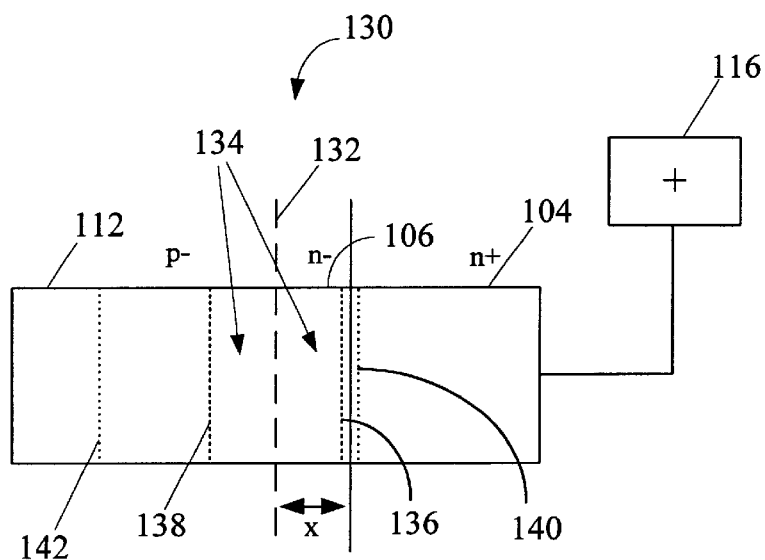
FIG. 6 is a generalized representation of a pn junction in the ESD protection device of FIG. 5.

FIG. 6 shows a generalized representation of a pn junction 130 that represents the ESD protection device 100 shown in FIG. 5. A reverse-bias voltage is applied to the external bond pad 116. Specifically, the pn junction 130, shown in FIG. 6, is an illustrative embodiment of the pn junction formed between the substrate 102, the first n-well 106, and the first n-plug 104 of the ESD protection device 100 shown in FIG. 5. The center of the pn junction 130 is marked by a centerline 132.

Assuming the doping concentrations of the lightly doped substrate 102 and the lightly doped first n-well 106 are approximately equal, a space charge region 134 widens in a substantially symmetric manner as shown by the initial positions of its first and second boundaries 136, 138. As the reverse-bias voltage increases, the space charge region 134 widens in a substantially symmetric manner until the first boundary 136 reaches the heavily doped first n-plug 104. The heavily doped first n-plug 104 essentially pins the first boundary 136, which causes the space charge region 134 to further widen in a substantially asymmetric manner as illustrated by boundaries 140, 142.

Because the space charge region 134 grows asymmetrically once the first boundary 136 is pinned by the heavily doped first n-plug 104, the electric field formed proximate the space charge region 134 reaches a critical value at a lower reverse-bias voltage. Consequently, the breakover voltage of the ESD protection device 100 is lowered. The breakover voltage may be tuned by increasing or decreasing the effective width of the lightly doped first n-well 106 (i.e., increasing or decreasing the distance "x" correspondingly increases or decreases the breakover voltage of the ESD protection device 100.

Returning now to FIG. 5, the minimum breakover voltage of the ESD protection device 100 may be attained by reducing the distance "x" to zero, (i.e., positioning the first n-plug 104 against the first edge 122 of the first n-well 106). Typically, the minimum breakover voltage that may be attained, by reducing the distance "x" to zero, is approximately 10–12V. Conversely, if the distance "x" is increased beyond a certain point, the space charge region 134 (shown in FIG. 6) is prevented from being pinned by the more heavily doped first n-plug 104. Typically, the maximum breakover voltage that may be attained, by increasing the distance "x", is approximately 30–50V.

The second n-plug 108, shown in FIG. 5, is positioned against a first edge 144 of the second n-well 110. The second n-well 110 increases the power distribution when the ESD protection device 100 switches "on" (i.e., begins to conduct current) by increasing the mass and current paths in which the ESD pulse may be dissipated. The power is dissipated along the edge 144 of the second n-well 110, as opposed to just the edge of the second n-plug 108. Also, the second n-well 110 increases the mass in which the ESD pulse is dissipated, thus, reducing the heat generated by the ESD pulse. In addition, the position of the second n-plug 108 determines the resistance of the current paths during snapback conduction (i.e., the resistance when the ESD protection device 100 is operating in a snapback mode).

Figure 7:
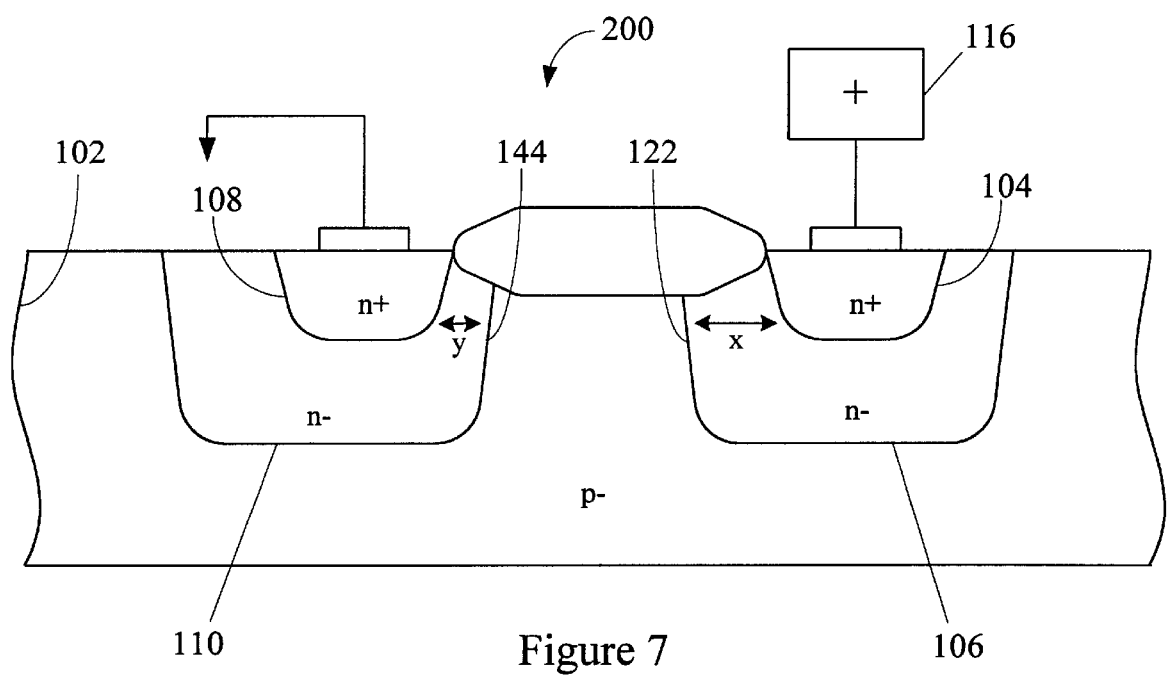
FIG. 7 is a cross-sectional view of a second embodiment of an ESD protection device in accordance with the present invention.

FIG. 7 shows a second illustrative embodiment of an ESD protection device 200 in accordance with the present invention. In FIG. 7, the second n-plug 108 is positioned a distance "y" away from the first edge 144 of the second n-well 110. The resistance of the current paths between the first and second n-plugs 104, 108 may be adjusted by increasing or decreasing the distance "y". Typically, if the distance "y" is increased, the resistance of the current paths increases, and if the distance "y" is decreased, the resistance of the current paths decreases.

Figure 7A:
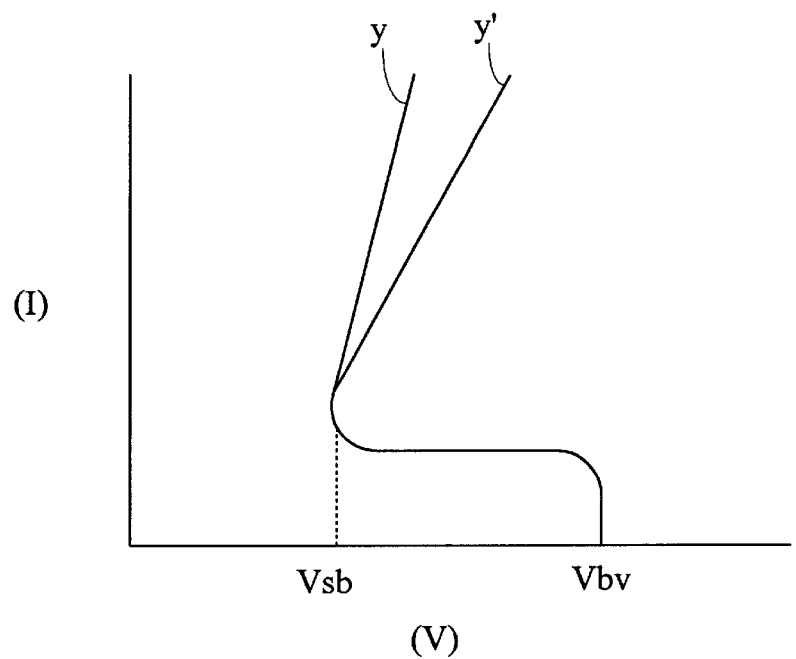
FIG. 7A is a current vs. voltage curve illustrating the operation of the ESD protection device of FIG. 7 in a snapback mode.

FIG. 7A shows two curves illustrating the current versus voltage characteristics of the ESD protection device 200 with the second n-plug 108 located in two different positions inside the second n-well 110. The first curve illustrates the characteristics of the ESD protection device 200 with the second n-plug 108 located a distance "y" from the first edge 144 of the second n-well 110. The second curve illustrates the characteristics of the ESD protection device 200 with the second n-plug 108 located a distance "y'" from the first edge 144 of the second n-well 110, where the distance "y'" is greater than "y." Because the distance "y'" is greater than the distance "y," the resistance of the current paths is greater for "y'" than it is for the distance "y." The increase in resistance of the current paths may be seen in FIG. 7A by the decrease in slope for the curve "y'." Those of ordinary skill in the art will appreciate that a current path with a lower resistance is desirable to prevent the ESD pulse from destroying the ESD protection device 200, external bond pad 116, input buffer (not shown in this figure), etc.

In FIG. 7, the first n-plug 104 is positioned a distance "x" from the first edge 122 of the first n-well 106. The breakover voltage of the ESD protection device 200 may be tuned by increasing or decreasing the distance "x" (i.e., the breakover voltage of the ESD protection device 200 may be increased or decreased by adjusting the distance "x").

Figure 8:
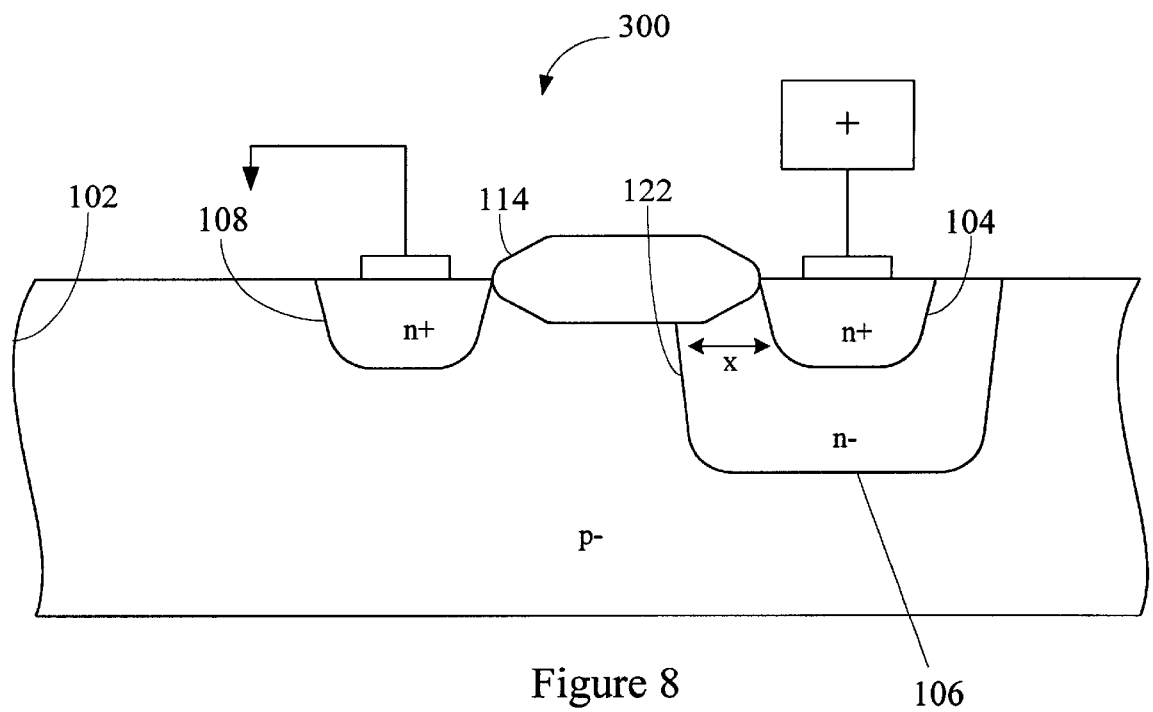
FIG. 8 is a cross-sectional view of a third embodiment of an ESD protection device in accordance with the present invention.

FIG. 8 shows a third illustrative embodiment of an ESD protection device 300 in accordance with the present invention. In FIG. 8, the second n-plug 108 is formed without the second n-well 110 shown in the illustrative embodiments of FIGS. 6 and 7. Again, the resistance of the current paths may be increased or decreased by altering the location of the second n-plug 108. Typically, if the distance between the isolation structure 114 and the second n-plug 108 is increased, the resistance of the current path between the first and second n-plugs 104, 108 increases.

In FIG. 8, the first n-plug 104 is positioned a distance "x" from the first edge 122 of the first n-well 106. The breakover voltage of the ESD protection device 300 may be tuned by adjusting the distance "x" (i.e., the breakover voltage of the ESD protection device 300 may be increased or decreased by increasing or decreasing the distance "x").

Figure 9:
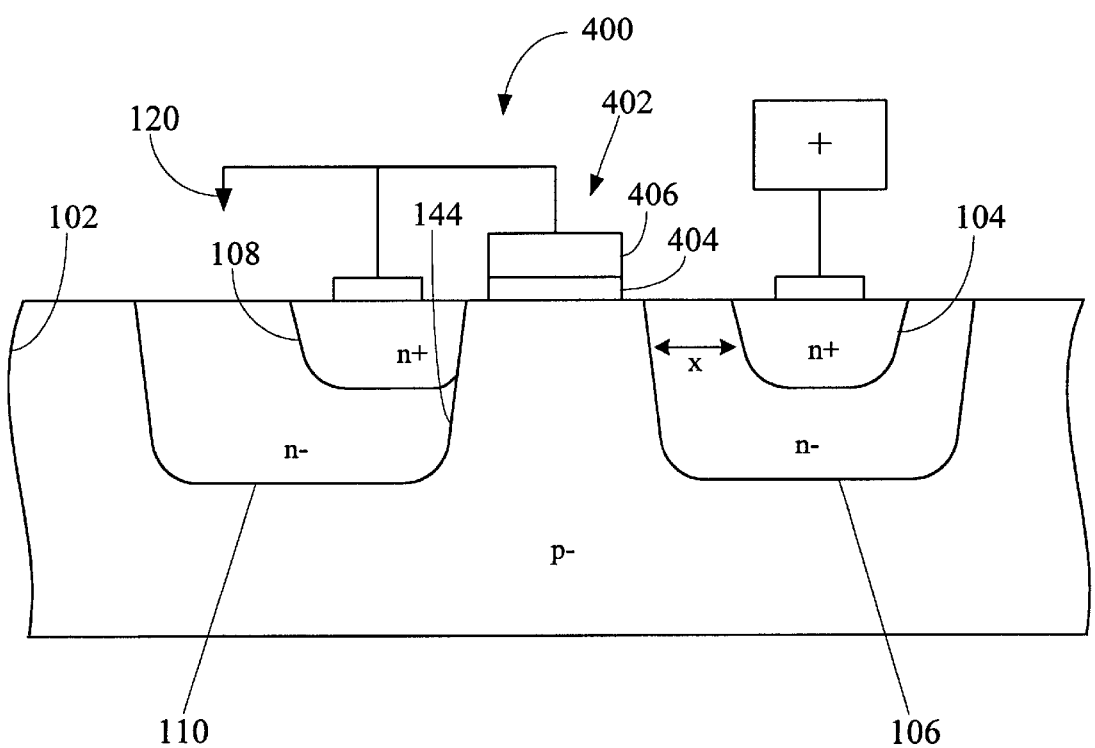
FIG. 9 is a cross-sectional view of yet another embodiment of an ESD protection device in accordance with the present invention.

FIG. 9 shows a fourth illustrative embodiment of an ESD protection device 400 in accordance with the present invention. In FIG. 9, the ESD protection device 400 includes a gate terminal 402 located between the first and second n-wells 106, 110 and coupled to the ground node 120. The gate terminal 402 includes a dielectric layer 404 and a conductor layer 406.

The dielectric layer 404 functions to electrically isolate the gate terminal 402 from the substrate 102. The dielectric layer 404 may be formed in a variety of shapes and from a variety of materials. In one embodiment, the dielectric layer 404 is silicon dioxide and is typically known as the gate oxide. The conductor layer 406 electrically couples the gate terminal 402 of the ESD protection device 400 to a ground node 120 or to a power supply node (not shown). Those of ordinary skill in the art will appreciate that the conductor layer 406 may be formed from a variety of materials and may be formed in a variety of shapes. In one embodiment, the conductor layer 406 may be polysilicon. Alternatively, the conductor layer 406 may be metal (e.g., aluminum).

The breakover voltage of the ESD protection device 400, shown in FIG. 9, may be tuned by increasing or decreasing the distance "x" (i.e., the breakover voltage of the ESD protection device 400 may be increased or decreased by adjusting the distance "x"). In addition, the resistance of the currents path between the first and second n-plugs 104, 108 may be increased or decreased by altering the location of the second n-plug 108. Typically, if the distance between second n-plug 108 and the first edge 144 of the second n-well 110 is increased the resistance of the current paths increases. It is contemplated that the ESD protection device of FIG. 9 may be formed without the second n-well 110.

Figure 10:
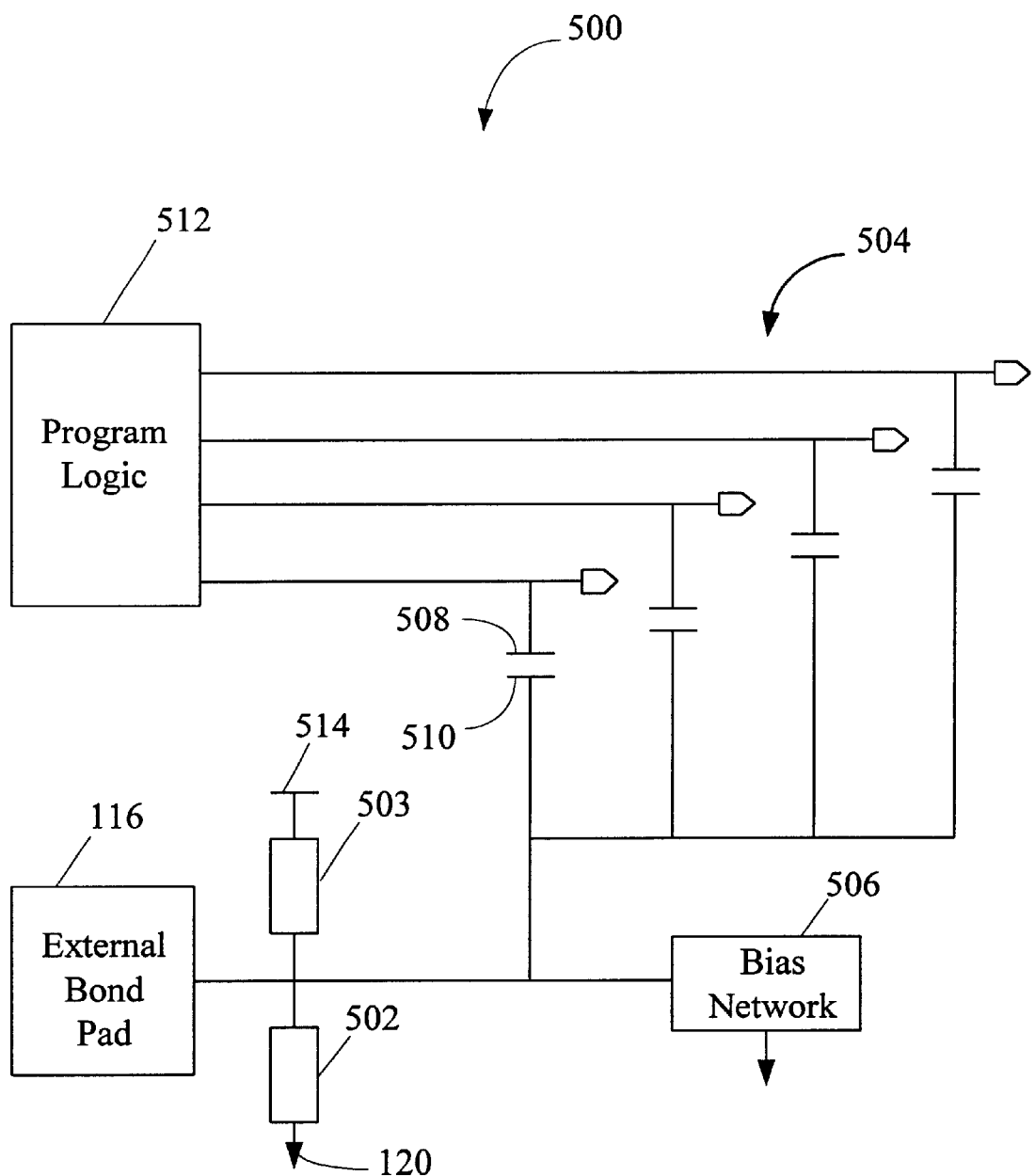
FIG. 10 is a block diagram of an integrated circuit device including an ESD protection device in accordance with the present invention.

FIG. 10 illustrates an integrated circuit 500 with first and second ESD protection devices 502, 503. The first and second ESD protection devices 502, 503 may be any of the ESD devices 100, 200, 300, and 400 shown in FIGS. 5, 7, 8, and 9. The first and second ESD protection devices 502, 503 are positioned to protect an anti-fuse network 504 from an ESD pulse. It is contemplated that the present invention may be adapted to protect a variety of high voltage inputs or outputs and is not limited to anti-fuse network 504 applications. The anti-fuse network 504 includes an external bond pad 116, a bias network 506, various first and second plates 508, 510, and a programming logic block 512. The first ESD protection device 502 is coupled between the external bond pad 116 and a ground node 120. The second ESD protection device 503 is coupled between the external bond pad 116 and a power supply node 514.

A potential difference is applied across the various first and second plates 508, 510 to program the anti-fuse network 504. The external bond pad 116 functions as a virtual ground that determines the potential difference applied across the various first and second plates 508, 510 of the anti-fuse network 504. Typically, the programming logic block 512 selects which first plates 508 of the anti-fuse network 504 to electrically ground. The voltages of the second plates are then raised by applying a programming voltage to the external bond pad 116 to a magnitude sufficient to rupture the dielectric (not shown) between the selected first plates 508 and the corresponding second plates 510. The ruptured dielectric (not shown) provides a current path that may be detected during the configuration of the integrated circuit device 500 to read the status of the anti-fuse network 504.

The breakover voltage of the first and second ESD protection devices 502, 503 may be tuned to a value greater than the programming voltage applied to the terminal of the external bond pad 116. The breakover voltage of the first and second ESD protection devices 502, 503 is selected greater than the programming voltage applied to the external bond pad 116 to ensure that the anti-fuse network 504 may be programmed without inadvertently switching "on" the first and second ESD protection devices 502, 503. For example, if a potential difference of 14 volts is required to program the anti-fuse network 504, the breakover voltage of the first and second ESD protection devices 502, 503 may be tuned to 20V or any value comfortably above 14V. It is contemplated that the breakover voltage of the first and second ESD protection devices 502, 503 may be tuned to a variety of values depending upon the specific application.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
    a first doped region;
    a first doped well disposed within the first doped region;
    a first doped plug disposed at a location within the first doped well, said location selected to provide a first breakover voltage between the first doped plug and the first doped region;
    a second doped plug disposed within the first doped region; and
    an isolation structure disposed between the first and second doped plugs,
        wherein a second breakover voltage exists between the first doped well and the first doped region, and the first breakover voltage is less than the second breakover voltage.

2. The apparatus of claim 1, further comprising a second doped well disposed within the first doped region, wherein the second doped plug is disposed within the second doped well.

3. The apparatus of claim 1, wherein the first doped plug has a first boundary, the first doped well has a second boundary, and the first breakover voltage is dependent on the proximity of the first boundary to the second boundary.

4. The apparatus of claim 2, wherein the second doped well has a first boundary, the second doped plug has a second boundary, and the second boundary is proximate the first boundary.

5. The apparatus of claim 1, wherein the isolation structure is at least one of a LOCOS oxide and a surface trench filled with an oxide.

6. The apparatus of claim 1, wherein the isolation structure is a gate terminal comprising a dielectric layer disposed adjacent to at least a portion of the first doped region and a conductor layer disposed above at least a portion of the dielectric layer.

7. The apparatus of claim 1, further comprising a conductor layer disposed above at least a portion of the first and second doped plugs.

8. The apparatus of claim 1, wherein the first doped region comprises a p-type material.

9. The apparatus of claim 1, wherein the first and second doped plugs comprise an n-type material.

10. The apparatus of claim 2, wherein the first and second doped wells comprise an n-type material, and the doping concentrations of the first and second doped wells are less than the doping concentrations of the first and second doped plugs.

11. The apparatus of claim 1, wherein the first breakover voltage is within a range of about 10–50V.

12. An apparatus, comprising:
    a p-type semiconductor substrate;
    a first n-well disposed within the semiconductor substrate;
    a first n-plug disposed at a location within the first n-well, said location selected to provide a first breakover voltage between the first doped plug and the first doped region;
    a second n-plug disposed within the p-type semiconductor substrate;
    an isolation structure disposed between the first and second n-plugs,
        wherein a second breakover voltage exists between the first n-well and the p-type semiconductor substrate, and the first breakover voltage is less than the second breakover voltage.

13. The apparatus of claim 12, further comprising a second n-well disposed within the p-type semiconductor substrate, wherein the second n-plug is disposed within the second n-well.

14. The apparatus of claim 13, wherein the second n-well has a first boundary, the second n-plug has a second boundary, and the second boundary is proximate the first boundary.

15. The apparatus of claim 12, wherein the first n-plug has a first boundary, the first n-well has a second boundary, and the first breakover voltage is dependent on the proximity of the first boundary to the second boundary.

16. The apparatus of claim 12, wherein the isolation structure is at least one of a LOCOS oxide and a surface trench filled with an oxide.

17. The apparatus of claim 12, wherein the isolation structure is a gate terminal comprising a dielectric layer disposed adjacent to at least a portion of the first doped region and a conductor layer disposed above at least a portion of the dielectric layer.

18. The apparatus of claim 12, wherein the first breakover voltage is within a range of about 10–50V.

19. An integrated circuit, comprising:

an external bond pad;

a voltage source;

an ESD protection device coupled between the external bond pad and the voltage source, wherein the ESD protection device comprises:

a first doped region;

a first doped well disposed within the first doped region;

a first doped plug disposed at a location within the first doped well and coupled to the external bond pad, said location selected to provide a first breakover voltage between the first doped plug and the first doped region;

a second doped plug disposed within the first doped region and coupled to the voltage source; and an isolation structure disposed between the first and second doped plugs, wherein the ESD protection device comprises a second breakover voltage between the first doped well and the first doped region, and the first breakover voltage is less than the second breakover voltage, and at least one integrated component coupled to the ESD protection device.

20. The integrated circuit of claim 19, wherein the ESD protection device further comprises a second doped well disposed within the first doped region, wherein the second doped plug is disposed within the second doped well.

21. The integrated circuit of claim 19, wherein the first doped plug of the ESD protection device has a first boundary, the first doped well has a second boundary, and the first breakover voltage is dependent on the proximity of the first boundary to the second boundary.

22. The integrated circuit of claim 20, wherein the second doped well of the ESD protection device has a first boundary, the second doped plug has a second boundary, and the second boundary is proximate the first boundary.

23. The integrated circuit of claim 19, wherein the isolation structure of the ESD protection device is at least one of a LOCOS oxide and a surface trench filled with an oxide.

24. The integrated circuit of claim 19, wherein the first doped region of the ESD protection device comprises a p-type material.

25. The integrated circuit of claim 19, wherein the first and second doped plugs of the ESD protection device comprise an n-type material.

26. The integrated circuit of claim 19, wherein the first and second doped wells of the ESD protection device comprise an n-type material, and the doping concentrations of the first and second doped wells are less than the doping concentrations of the first and second doped plugs.

27. The integrated circuit of claim 19, wherein the second breakover voltage of the ESD protection device is within a range of about 10–50V.

28. The integrated circuit of claim 19, wherein the voltage source is coupled to ground.

29. The integrated circuit of claim 19, wherein the voltage source is coupled to a power supply.

30. The integrated circuit of claim 19, further comprising a buffer coupled between the ESD protection device and the integrated components.

31. The integrated circuit of claim 19, wherein the integrated component is an anti-fuse network.

* * * * *